US 6,598,193 B1

(12) United States Patent
Li et al.

(10) Patent No.: US 6,598,193 B1
(45) Date of Patent: Jul. 22, 2003

(54) SYSTEM AND METHOD FOR TESTING COMPONENT IC CHIPS

(75) Inventors: Shaojie Li, Austin, TX (US); Frank L. Wu, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/489,710

(22) Filed: Jan. 24, 2000

(51) Int. Cl.[7] .............................................. G01R 31/28
(52) U.S. Cl. ...................................................... 714/727
(58) Field of Search .......................................... 714/727

(56) References Cited

U.S. PATENT DOCUMENTS

| | | | | |
|---|---|---|---|---|
| 4,945,536 A | * | 7/1990 | Hancu | 714/724 |
| 5,353,240 A | | 10/1994 | Mallory et al. | 364/552 |
| 5,355,369 A | | 10/1994 | Greenberger et al. | 371/22.3 |
| 5,570,375 A | | 10/1996 | Tsai et al. | 371/22.3 |
| 5,706,297 A | | 1/1998 | Jeppesen, III et al. | 371/22.3 |
| 5,823,818 A | | 10/1998 | Bell et al. | 439/482 |
| 5,828,827 A | | 10/1998 | Mateja et al. | 315/183.06 |
| 5,852,617 A | | 12/1998 | Mote, Jr. | 371/22.31 |
| 5,898,704 A | | 4/1999 | Kawano | 371/22.32 |
| 6,003,142 A | * | 12/1999 | Mori | 714/30 |
| 6,119,252 A | * | 9/2000 | Roohparvar et al. | 714/721 |
| 6,122,756 A | * | 9/2000 | Baxter et al. | 714/3 |
| 6,282,674 B1 | * | 8/2001 | Patel et al. | 714/30 |

FOREIGN PATENT DOCUMENTS

| | | | | |
|---|---|---|---|---|
| JP | 10143390 A | 11/1996 | | G06F/11/22 |
| JP | 11083952 A | 3/1999 | | G01R/31/28 |
| WO | WO 97/22013 | 6/1997 | | G01R/31/28 |

OTHER PUBLICATIONS

"Boundary Scan Logic"; Chapters 1—4<http://www.ti-ris.com/sc/docs/jtag/silicom.htm>, Dec. 15, 1999.

* cited by examiner

Primary Examiner—Albert Decady
Assistant Examiner—Cynthia Britt
(74) Attorney, Agent, or Firm—Baker Botts L.L.P.

(57) ABSTRACT

The present disclosure describes a system and method for testing component IC chips. The system includes a management controller that has an embedded JTAG test routine operable to test one or more component IC chips associated with the management controller. The system further includes a memory associated with the management controller and the management controller is further operable to save a JTAG test routine result within the memory. More specifically, the management controller is operable to test one or more associated component IC chips using the embedded JTAG test routine during boot up of the system.

18 Claims, 2 Drawing Sheets

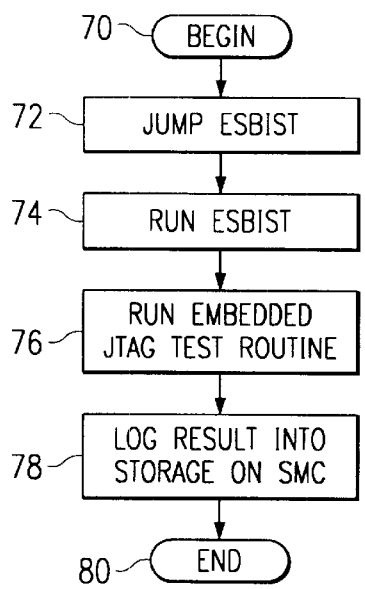
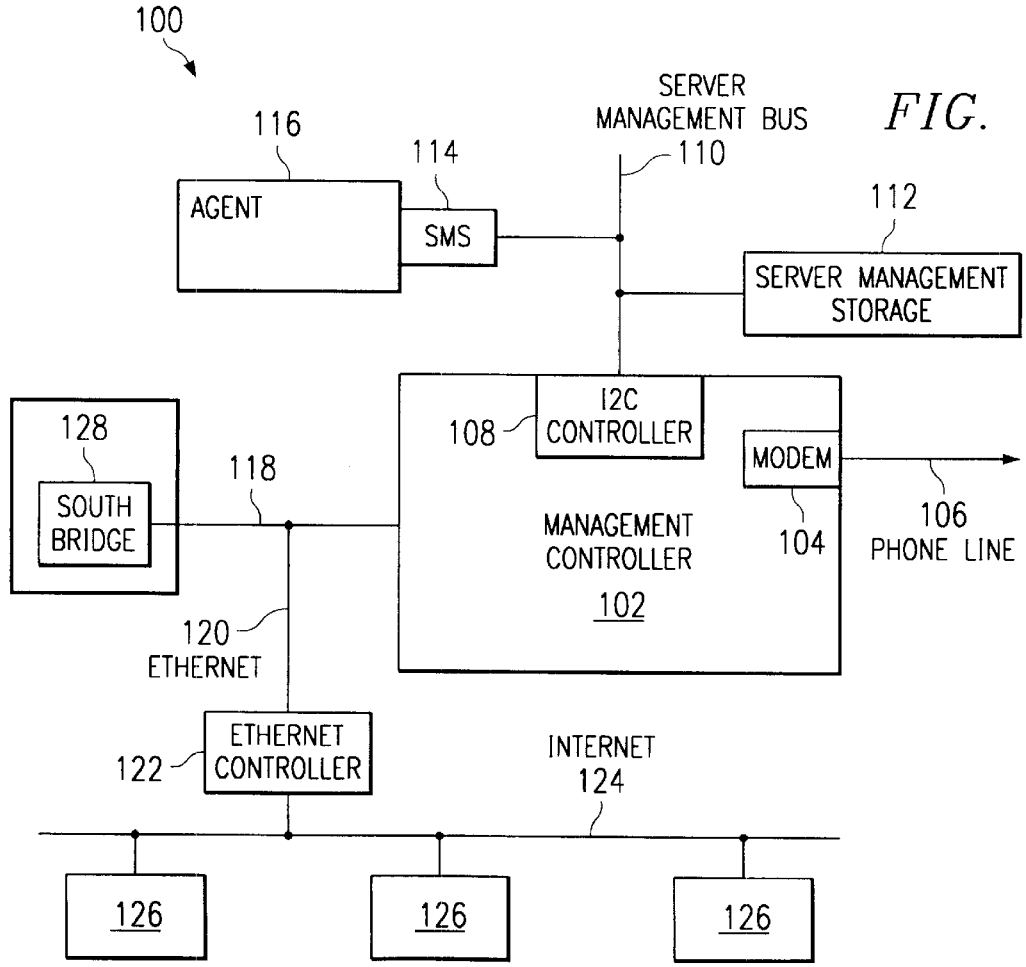

SYSTEM AND METHOD FOR TESTING COMPONENT IC CHIPS

TECHNICAL FIELD

This disclosure relates in general to the field of electronic devices. More specifically, this disclosure relates to a system and method for testing component IC chips.

BACKGROUND

Integrated circuit (IC) chips are a collection of small electronic devices integrated together to perform a number of different functions. As manufacturing techniques have developed, the size of these electronic devices has decreased while the density of electronic devices and the functionality of the IC chips has increased. IC chips are utilized in numerous applications in computer systems and other devices. Often, computer systems incorporate multiple IC chips each IC chip performing a specific function within the system. The IC chips, when installed on a common circuit board, are often referred to as "on-board" chips.

As the complexity of IC chips increases, the testing of IC chips takes on increased significance. One type of testing which is frequently used is JTAG testing, a standardized testing protocol. This standard has been adopted by the Institute of Electrical and Electronics Engineers, Inc. as IEEE Standard 1149.1, *IEEE Standard Test Access Port and Boundary-Scan Architecture*, and is incorporated herein be reference. Simply, JTAG testing involves sending an IC chip a selected test input and receiving test output from the IC chip. The test output is then compared with the expected output to evaluate the functionality of the IC chip.

Often, chips are individually tested for functionality when they are manufactured using specialized testing equipment. IC chips may be tested prior to being used to determine whether they will function according to their design. This testing often provides an effective means of quality control.

However, some defects and malfunctions may arise after this initial testing. These defects may seriously effect IC chip performance and functionality causing the IC chip to lose efficiency, malfunction, or cease functioning. In computer systems with multiple component IC chips, the defect or malfunction of one component IC chip may effect the other components of the system causing the entire system to lose efficiency, malfunction, or stop functioning altogether.

JTAG testing equipment may be used to test IC chips within a system to diagnose a problem or as part of a maintenance regimen. Such testing often requires skilled technicians to travel to a system site, connect the JTAG test equipment, and operate the JTAG test equipment. Often the system must be shut down, taken off line, or disassembled to perform these tests. JTAG testing using JTAG equipment consumes valuable time and resources. Traveling time and time spent connecting the JTAG equipment uses valuable technician time. Also, before testing is complete, a system may malfunction or be removed from service until a skilled technician is available to connect and operate the JTAG testing equipment. This time may seriously detract from system functionality, efficiency, and profitability.

SUMMARY

Therefore, a need has arisen for a system and method for testing component IC chips using JTAG test standards which does not require the use of separate testing equipment.

A further need has arisen for a system and method for performing JTAG tests on component IC chips without interrupting system operation.

In accordance with teachings of the present disclosure, a system and method are described for testing component IC chips. In one aspect, the system includes a management controller that has an embedded JTAG test routine operable to test one or more component IC chips associated with the management controller. The system also includes a memory associated with the management controller and the management controller is further operable to save a JTAG test routine result within the memory. More specifically, the management controller is preferably operable to test one or more associated component IC chips using the embedded JTAG test routine during boot up of the system.

In another aspect, the system includes a server that has a management controller and at least one component IC chip. The management controller is associated with the at least one component IC chip. A memory is also associated with the server. The management controller preferably has an embedded JTAG test routine which is operable to test the at least component IC chip and the management controller is further operable to save a JTAG test routine result for the at least one component IC chip in the memory.

More specifically, the embedded JTAG test routine may be incorporated into an embedded server boot initialization system test (ESBIST) within the management controller.

In yet another aspect, a method is disclosed for testing component IC chips in a computer system that includes installing a JTAG test routine in a management controller associated with the computer system. At least one component IC chip is tested using the JTAG test routine. Test results from the JTAG test routine may then be saved in a test log.

The present disclosure has many important technical advantages. One technical advantage is installing a JTAG test routine in the management controller. This allows the system to perform JTAG testing of system component IC chips without separate JTAG testing equipment. This also eliminates the need for a skilled technician to visit a system site and disassemble a system to perform JTAG tests. Another technical advantage is performing JTAG testing on component IC chips during normal boot up of the system. This allows testing to be performed without interrupting system operations.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 is a flow diagram showing method for testing component IC chips according to teachings of the present disclosure; and FIG. 4 is a diagram showing another computer system having network connections according to teachings of the present disclosure.

DETAILED DESCRIPTION

Figure 1:
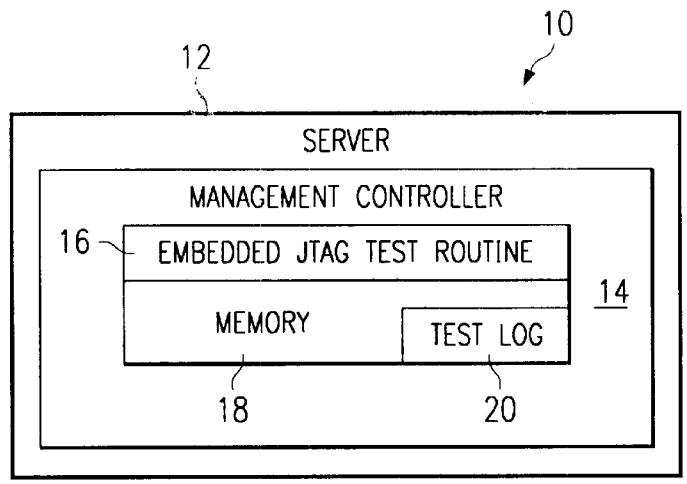
FIG. 1 is a diagram showing a computer system according to teachings of the present disclosure.
Figure 2:
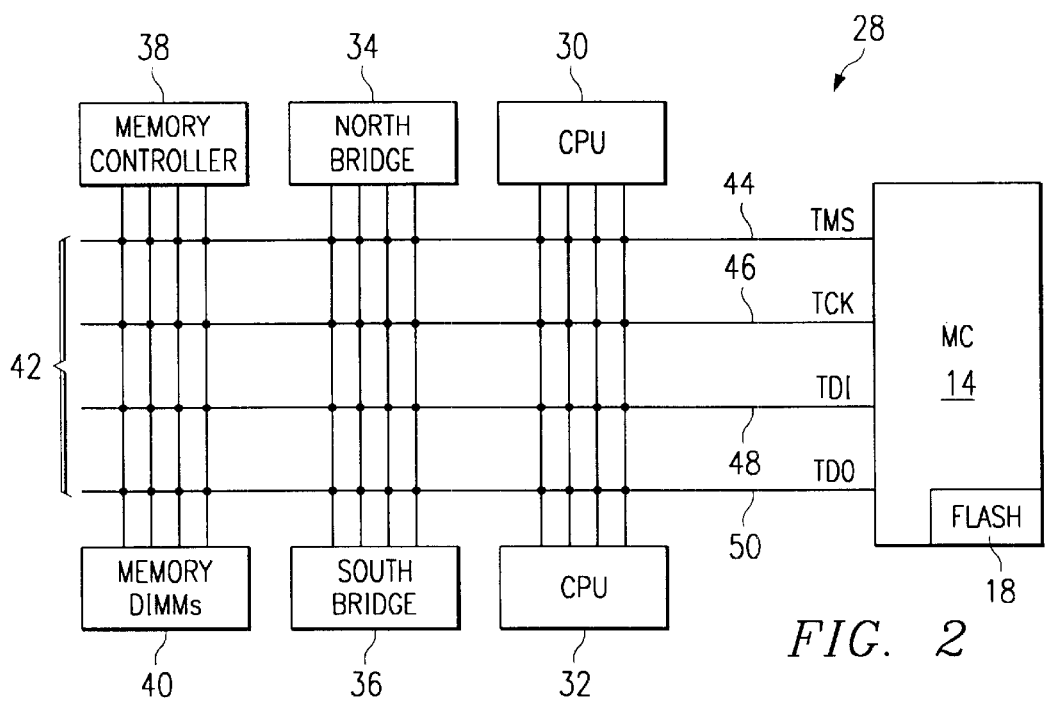
FIG. 2 is a diagram showing a computer system including component IC chips according to teachings of the present disclosure.

Referring now to FIG. 1, a diagram showing a computer system according to teachings of the present disclosure is depicted. The computer system, indicated generally at 10, includes server 12 having management controller 14. Management controller 14 preferably includes an embedded JTAG test routine and memory 18. Memory 18 further includes test log 20. System 10 may include one or more component IC chips (as shown in FIG. 2) and may be selectively networked (as shown in FIG. 4).

Management controller 14 manages operations between the component IC chips within server 12. In the present embodiment management controller 14 is preferably a server management controller. In an alternative embodiment management controller 14 may be a processor operable to support an embedded JTAG test routine within server 12 or another suitable system.

Embedded JTAG test routine 16 is loaded within management controller 14. In one embodiment, embedded JTAG test routine 16 is preferably associated with an embedded server boot initialization system test (ESBIST) utility associated with management controller 14. Embedded JTAG test routine 16 may automatically test selected system component IC chips during server boot up as part of ESBIST.

Memory 18 is a computer readable memory associated with management controller 14. Memory 18 is preferably a flash memory. In an alternative embodiment memory 14 may be a computer readable medium that is not erased or otherwise lost when power to server 12 is interrupted. In this embodiment memory 18 may be a static random access memory (SRAM), a programmable read only memory (PROM), a memory with a battery backup, or another suitable memory.

Memory 18 includes test log 20 for storing results of JTAG tests run by management controller 14. Test log 20 may include the time and date a previous JTAG test was performed by management controller 14 and the output for each component IC chip tested. Test log 20 is further operable to be downloaded onto a computer readable medium, accessed by a remote system, or transferred to a remote system for analysis.

In operation, when server 12 boots up, management controller 14 may automatically perform ESBIST. As part of ESBIST, management controller 14 preferably runs the embedded JTAG test routine 16 testing at least one component IC chip (as shown in FIG. 2). Running the embedded JTAG test routine 16 includes sending a preselected input to component IC chips and receiving a test output from the component IC chips. Management controller 14 then saves the test output from each component IC chip in test log 20.

Alternatively, embedded JTAG test routine 18 may be selectively run independent from ESBIST to test at least one selected component IC chip within server 12. During this selective testing, embedded JTAG test routine 18 selectively sends a preselected input to a component IC chip within server 12. The component IC chip then produces a test output that is received by management controller 14. Management controller 14 may then save the JTAG test output in test log 20.

The test output obtained from running embedded JTAG test routine stored in test log 20, obtained from either boot up testing or from selective testing, may be compared with an expected JTAG test output. Comparison of the test output with the expected JTAG test output may indicate a malfunction or defect within a component IC chip. The analysis of test log 20 may take place at the site of system 10 or may be performed at a remote location such as a support center.

Referring now to FIG. 2, a diagram showing a computer system, indicated generally at 28, including component IC chips is depicted. System 28 includes management controller 14 having memory 18. Management controller 14 is connected by bus 42 to component IC chips including, central processing unit 30, central processing unit 32, north bridge 34, south bridge 36, memory controller 38, and dual inline memory module (DIMMS). Component IC chips connected to management controller 14 by bus 42 may also be referred to as "on-board" chips.

Bus 42 preferably includes test mode select (TMS) 44, test clock (TCK) 46, test data input (TDI) 48, and test data output (TDO) 50. Management controller 14 performs JTAG testing by sending a preselected JTAG input to components 30, 32, 34, 36, 38, and 40.

In operation, management controller 14 controls JTAG testing using TMS 44 and TCK 46. Management controller 14 sends preselected test input to component IC chips along TDI 48. The test control information and test input interface with component IC chips through component IC chip input pins. Test output exits component IC chips through component IC chip output pins and returns to management controller 14 along TDO 50.

Referring now to FIG. 3 a flow diagram showing one method for testing component IC chips according to the present disclosure. The method preferably begins at 70 during system boot up. Management controller 14 (as shown in FIG. 1) may jump to ESBIST utility 72 and proceeds to run ESBIST 74. Management controller 14 then runs embedded JTAG test routine 76. Running embedded JTAG test routine 76 typically involves sending preselected test input to selected component IC chips and receiving test output from the selected IC chips. These test results may then be logged into the memory 78. The JTAG testing may then be concluded at 80 and the associated system is available to perform desired operations.

Referring now to FIG. 4, a diagram showing a computer system, indicated generally at 100, having network connections is depicted. System 100 includes management controller 102. Management controller 102 is preferably a server management controller. Management controller 102 includes modem 104 operable to connect to phone line 106. Management controller 102 further includes I²C controller 108 for connecting to server management bus 110. Server management storage 112 connects with server management bus 110. Agent system 116 having server management software (SMS) interface 114 also connects to server management bus 110. Agent 116 and server management storage 112 connect with server management bus 110 such that agent system 116 may access server management storage 112 without accessing management controller 102.

Management controller 102 connects to south bridge 130 within host 128 via bus 118. At least one component IC chip is associated with south bridge 130. Ethernet connection 120 connects bus 118 and Ethernet controller 122. Ethernet controller 122 may control access to and from internet 124 and plurality of remote systems 126.

In operation, management controller 102 may run embedded JTAG test routine 16 (as shown in FIG. 1), sending preselected test input and test instructions to selected component IC chips within host 128, associated with soft bridge 130. Test output from the selected component IC chips is then returned to management controller 102. Management controller 102 next saves the test results in server management storage 112. Alternatively, management controller 102 may save the test results in a test log within management controller 102 (as shown in FIG. 1).

Agent 116 may connect to server management storage 112 through bus 110 and access test results stored therein. In this manner, agent 116 may access test results without interfacing with management controller 102. Agent 116 may download a copy of the test results in server management storage 112 to be analyzed by a technician to investigate a system malfunction or identify a defective component IC chips or for routine maintenance purposes.

Management controller 102 is further operable to selectively transfer a test result or a log of previous test results to remote systems 126 through modem 104 and phone line 106 or Ethernet controller 122 and internet 124. Alternatively, remote systems 126 may be allowed selective access to management controller 102 through phone line 106, internet 124, Ethernet 120, or I²C controller 108 to access a test result or a log of previous test results. Once accessed, the test results may be analyzed to identify malfunctioning or defective component IC chips remotely.

Although the disclosed embodiments have been described in detail, it should be understood that various changes, substitutions and alterations can be made to the embodiments without departing from their spirit and scope.

What is claimed is:

1. A computer system having a management controller for testing component IC chips comprising:

the management controller having an embedded JTAG test routine operable to test at least one component IC chip associated with the computer system;

a memory associated with the management controller; and the management controller further operable to save a JTAG test result within a test log within the memory, the test log operable to store JTAG test results from a plurality of JTAG tests.

2. The computer system of claim 1 further comprising the management controller operable to automatically test the at least one component IC chip during boot up of the computer system.

3. The computer system of claim 1 further comprising the management controller operable to selectively test the at least one component IC chip using the embedded JTAG test routine.

4. The computer system of claim 1 wherein the memory comprises a flash memory.

5. The computer system of claim 1 wherein the memory comprises a programmable read only memory.

6. The computer system of claim 1 further comprising:

a remote system selectively connected with the memory; and the remote system operable to access the test log.

7. The computer system of claim 1 further comprising the management controller operable to send information from the test log to a remote system selectively connected to the management controller.

8. The computer system of claim 1 further comprising:

a plurality of component IC chips associated with the management controller; and the embedded JTAG test routine operable to test the plurality of component IC chips.

9. A computer system comprising:

a server having a management controller and at least one component IC chip;

the management controller associated with the at least one component IC chip;

a memory associated with the server;

the management controller having an embedded JTAG test routine operable to test the at least one component IC chip; and the management controller further operable to save a JTAG test routine result for the at least one component IC chip within a test log within the memory, the test log operable to store JTAG test routine results from a plurality of JTAG tests.

10. The computer system of claim 9 further comprising the management controller operable to automatically test the at least one component IC chip during computer system boot up.

11. The computer system of claim 9 further comprising the management controller operable to selectively test the at least one component IC chip.

12. The computer system of claim 9 wherein the management controller further comprises:

an embedded server boot initialization system test; and the embedded JTAG test routine associated with the embedded server boot initialization system test.

13. A method for testing on-board components in a computer system comprising:

installing a JTAG test routine in a management controller associated with the computer system;

testing at least one on-board component IC chip using the JTAG test routine associated with the management controller; and saving test results from the JTAG test routine in a test log operable to store JTAG test routine results from a plurality of JTAG tests.

14. The method of claim 13 further comprising testing during a boot up of the computer system.

15. The method of claim 13 wherein testing further comprises selectively testing the at least one on-board component IC chip.

16. The method of claim 13 further comprising evaluating the at least one on-board component IC chip using the test log.

17. The method of claim 13 further comprises:

accessing the test log from a remote system; and evaluating the at least one on-board component IC chip using the at least two JTAG test routine results stored within the test log.

18. The method of claim 17 wherein accessing further comprises remotely accessing the test log.

* * * * *